(12) United States Patent
Schimmel et al.

(10) Patent No.: US 8,232,537 B2
(45) Date of Patent: Jul. 31, 2012

(54) RADIATION SOURCE, LITHOGRAPHIC APPARATUS AND DEVICE MANUFACTURING METHOD

(75) Inventors: Hendrikus Gijsbertus Schimmel, Utrecht (NL); Vadim Yevgenyevich Banine, Helmond (NL); Erik Roelof Loopstra, Eindhoven (NL)

(73) Assignee: ASML Netherlands, B.V., Veldhoven (NL)

( * ) Notice: Subject to any disclaimer, the term of this patent is extended or adjusted under 35 U.S.C. 154(b) by 252 days.

(21) Appl. No.: 12/540,542

(22) Filed: Aug. 13, 2009

(65) Prior Publication Data

US 2010/0157267 A1   Jun. 24, 2010

Related U.S. Application Data

(60) Provisional application No. 61/193,719, filed on Dec. 18, 2008.

(51) Int. Cl.
*H05G 2/00* (2006.01)
(52) U.S. Cl. ............. 250/504 R; 250/492.1; 250/493.1; 250/503.1
(58) Field of Classification Search ............... 250/492.1, 250/492.2, 493.1, 503.1, 504 R
See application file for complete search history.

(56) References Cited

U.S. PATENT DOCUMENTS

| 7,141,798 | B2 * | 11/2006 | Ito et al. | 250/372 |
| 2004/0109151 | A1 | 6/2004 | Bakker et al. | |
| 2005/0205803 | A1 * | 9/2005 | Mizoguchi | 250/492.2 |
| 2005/0205810 | A1 | 9/2005 | Akins et al. | |
| 2005/0230645 | A1 | 10/2005 | Melnychuk et al. | |
| 2006/0078089 | A1 | 4/2006 | Masaki et al. | |
| 2006/0243927 | A1 * | 11/2006 | Tran et al. | 250/504 R |
| 2006/0250599 | A1 * | 11/2006 | Bakker et al. | 355/67 |

FOREIGN PATENT DOCUMENTS

| WO | 2006135546 A2 | 12/2006 |
| WO | 2007005415 A2 | 1/2007 |
| WO | 2008072959 A2 | 6/2008 |

OTHER PUBLICATIONS

EPO Search Report issued May 25, 2010 in corresponding EP Patent Application No. EP 09 16 9802.7.
European Examination Report for European Patent Application No. 09169802.7, mailed on Mar. 29, 2011.

* cited by examiner

*Primary Examiner* — Michael Maskell
*Assistant Examiner* — Hanway Chang
(74) *Attorney, Agent, or Firm* — Pillsbury Winthrop Shaw Pittman LLP

(57) ABSTRACT

A radiation source for generation of extreme ultraviolet radiation or use in high resolution lithography includes a plasma formation site where fuel is contacted by a radiation beam to form a plasma generating EUV radiation. A mirrored collector collects and reflects the EUV radiation generated at a first focus towards a second focus. A contamination barrier is positioned such the periphery of the contamination barrier does not occlude more than 50% of the solid angle subtended by the mirror at the second focus, such that EUV radiation reflected by the collector mirror is not excessively attenuated by passing through the contamination barrier. The contamination barrier serves to trap fuel material such as ions, atoms, molecules or nanodroplets from the plasma to prevent their deposition onto the collector mirror where they reduce the mirror's effective lifetime.

20 Claims, 3 Drawing Sheets

RADIATION SOURCE, LITHOGRAPHIC APPARATUS AND DEVICE MANUFACTURING METHOD

CROSS-REFERENCE TO RELATED APPLICATIONS

This application claims the benefit of priority from U.S. Provisional Patent Application Ser. No. 61/193,719, filed Dec. 18, 2008, the content of which is incorporated herein by reference in its entirety.

FIELD

The present invention relates to a radiation source, a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Known lithographic apparatus include so-called steppers, in which each target portion is irradiated by exposing an entire pattern onto the target portion at one time, and so-called scanners, in which each target portion is irradiation by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Lithography is widely recognized as one of the key steps in the manufacture of ICs and other devices and/or structures. However, as the dimensions of features made using lithography become smaller, lithography is becoming a more important factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$ or by decreasing the value of $k_1$.

In order to shorten the exposure wavelength and, thus, reduce the minimum printable size, it has been proposed to use an extreme ultraviolet (EUV) radiation source. EUV radiation sources are configured to output a radiation wavelength of about 13 nm. Thus, EUV radiation sources may constitute a significant step toward achieving small features printing. Such radiation is termed extreme ultraviolet or soft x-ray, and possible sources include, for example, laser-produced plasma sources, discharge plasma sources, or synchrotron radiation from electron storage rings.

In order to produce such radiation, a plasma may be produced in a so-called laser produced plasma (LPP) source by focusing a laser at a fuel droplet (typically a tin droplet), thereby changing the droplet, into an extreme ultraviolet radiation producing plasma. Often, a so-called collector or collector mirror may be used to collect the radiation that is generated by the plasma and focus the radiation in a focal point. In radiation sources that use fuel droplets, such as tin, as a fuel to create a plasma, the deposition rate of the fuel (e.g. tin) onto a collector mirror may be high, which may decrease the life time of the collector.

SUMMARY

It is desirable to reduce the deposition rate of plasma fuel material (e.g. tin), including deposition in the form of ions, atoms, molecules and particulate debris (such as nanodroplets) onto a collector mirror of an EUV radiation source. It is also desirable to provide a contamination barrier to reduce the deposition rate of plasma fuel droplets onto a collector mirror while minimizing the amount of EUV radiation that is absorbed, scattered or deflected by the contamination barrier.

Hence, it is an aspect of embodiments of the invention, amongst others, to provide an EUV radiation source with an improved life time for the collector mirror.

An aspect of the invention provides a radiation source configured to generate extreme ultraviolet radiation, the radiation source comprising: a plasma formation site located at a position in which a fuel is contacted by a beam of radiation to form a plasma, a collector constructed and arranged to collect extreme ultraviolet radiation formed at the plasma formation site, the collector comprising a mirror to reflect the extreme ultraviolet radiation to a second focal point, wherein the position of the plasma formation site is at a first focal point of the collector at a focal distance F from the collector measured along an optical axis defined by the first focal point and the second focal point, and a contamination barrier having a periphery and located between the plasma formation site and the collector, wherein the periphery of the contamination bather does not occlude more than 50% of the solid angle subtended by the mirror at the second focal point.

The periphery of the contamination barrier may occlude, for instance, no more than 40%, 20% or 10% of the solid angle subtended by the mirror at the second focal point.

Desirably, the periphery of the contamination barrier does not occlude the solid angle subtended by the mirror at the second focal point. In this case, the EUV light from the plasma formation only passes through the contamination barrier on its way to the collector, and not after reflection by the collector mirror on its way towards the second focal point.

The focal distance F is measured from the first focal point to the point where the extrapolated reflective surface of the collector mirror meets the optical axis.

The periphery of the contamination barrier is the surface, which may be an imaginary surface, connecting the outermost parts of the contamination barrier as measured from the plasma formation site.

The second focal point will typically be a real point a finite distance from the first focal point, but in some arrangements the second focal point may be situated at infinity.

The collector may include an aperture arranged to allow the beam of radiation to pass through collector to contact the fuel at the plasma formation site. The contamination barrier may suitably be situated entirely within the solid figure subtended by the aperture at the second focal point.

The beam of radiation is suitably a laser beam such as from a solid state laser device.

The collector may comprise a nozzle having a gas inlet port and a gas outlet port arranged to direct a gas flow towards the plasma formation site. Typically such a gas flow is of hydrogen. The aperture allowing the beam of radiation used to form the plasma to pass through the collector may be arranged to also be the gas inlet port of the nozzle. The nozzle is suitably conical in shape.

The contamination barrier may be conveniently attached to the nozzle, for instance it may be carried by the nozzle. In particular, the contamination barrier may be attached to the gas outlet port of the nozzle.

The contamination barrier may be static relative to the collector, such that it does not move relative to the collector, or it may be rotatable relative to the collector.

The radiation source may also comprise a gas extraction port positioned and configured to extract gas from near the plasma formation site. Suitably, the gas extraction port is located within 0.5 F of the plasma formation site, such as within 0.3 F or for instance within 0.2 F of the plasma formation site.

The location of the gas extraction port may be determined by the centroid of the port's inlet area.

A gas extraction port may be located between the second focal point and a plane normal to the optical axis and passing through the plasma formation site.

An aspect of the invention provides a radiation source configured to generate extreme ultraviolet radiation, the radiation source comprising: a plasma formation site located at a position in which a fuel is contacted by a beam of radiation to form a plasma, a collector constructed and arranged to collect extreme ultraviolet radiation formed at the plasma formation site, the collector comprising a mirror to reflect the extreme ultraviolet radiation to a second focal point, wherein the position of the plasma formation site is at a first focal point of the collector at a focal distance F from the collector measured along an optical axis defined by the first focal point and the second focal point, and a gas extraction port positioned and configured to extract gas from near the plasma formation site.

A gas extraction port may be located within 0.5 F or less of the plasma formation site, such as within 0.3 F, for instance within 0.2 F, of the plasma formation site. The gas extraction port maybe located between the second focal point and a plane normal to the optical axis and passing through the plasma formation site.

An aspect of the invention provides a lithographic apparatus configured to pattern a substrate. The lithographic apparatus comprises a radiation source according to the aspects of the invention detailed hereinbefore, a support constructed and arranged to support a patterning device, the patterning device being configured to pattern extreme ultraviolet radiation from the source directed towards the second focal point, and a projection system constructed and arranged to project the patterned radiation onto said substrate.

An aspect of the invention provides a device manufacturing method comprising: generating extreme ultraviolet radiation at a plasma formation site, gathering contamination generated with the extreme ultraviolet radiation from the plasma formation site with a contamination barrier having a periphery and located between the plasma formation site and a collector comprising a mirror, collecting the extreme ultraviolet radiation that has passed through the contamination barrier with the collector, reflecting the extreme ultra-violet radiation with the mirror towards a second focal point, patterning the extreme ultra-violet radiation reflected towards the second focal point with a patterning device, and projecting the patterned extreme ultraviolet radiation onto a substrate, wherein the periphery of the contamination barrier does not occlude more than 50% of the solid angle subtended by the mirror at the second focal point.

An aspect of the invention provides a device manufacturing method comprising: generating extreme ultraviolet radiation at a plasma formation site, collecting the extreme ultraviolet radiation that has passed through the contamination barrier with a collector comprising a mirror, reflecting the extreme ultra-violet radiation with the mirror towards a second focal point, patterning the extreme ultra-violet radiation reflected towards the second focal point with a patterning device, projecting the patterned extreme ultraviolet radiation onto a substrate, and extracting gas from near the plasma formation site with a gas extraction port.

The features detailed hereinbefore for the radiation sources of the invention are also applicable to the device manufacturing methods of the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
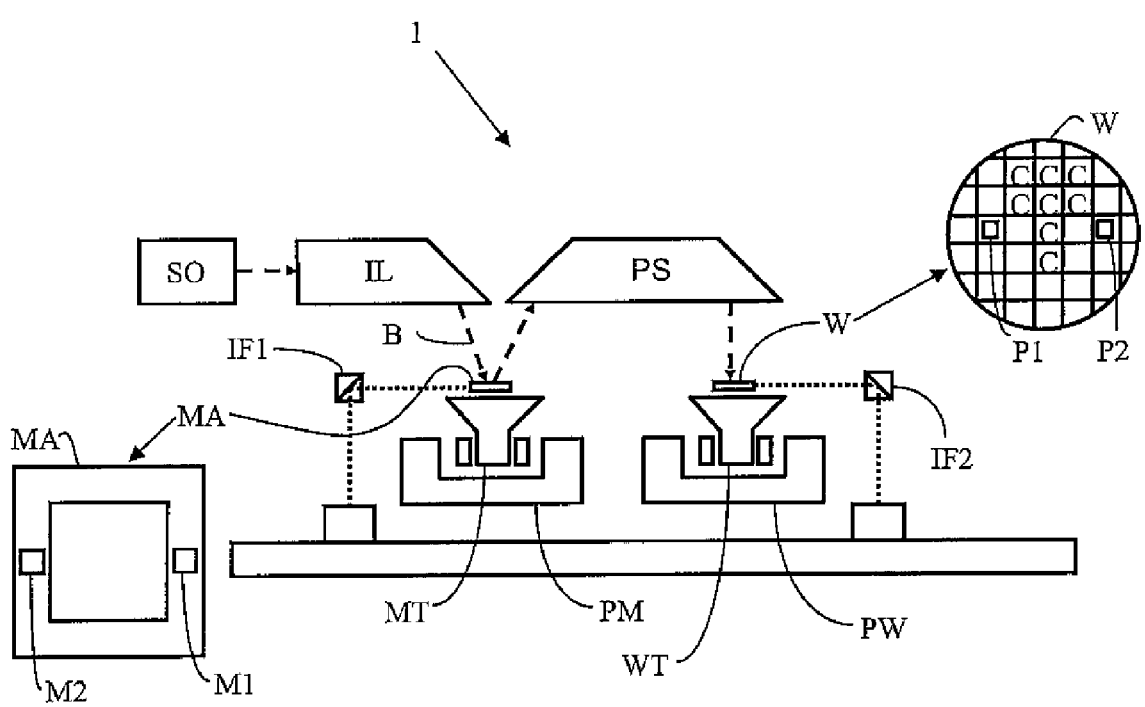
FIG. 1 depicts a schematic view of a lithographic apparatus.

FIG. 1 schematically depicts a lithographic apparatus according to one embodiment of the invention. The apparatus comprises: an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" may encompass any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. It may be desired to use a vacuum for EUV or electron beam radiation since other gases may absorb too much radiation or electrons. A vacuum environment may therefore be provided to the whole beam path with the aid of a vacuum wall and vacuum pumps.

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing minors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
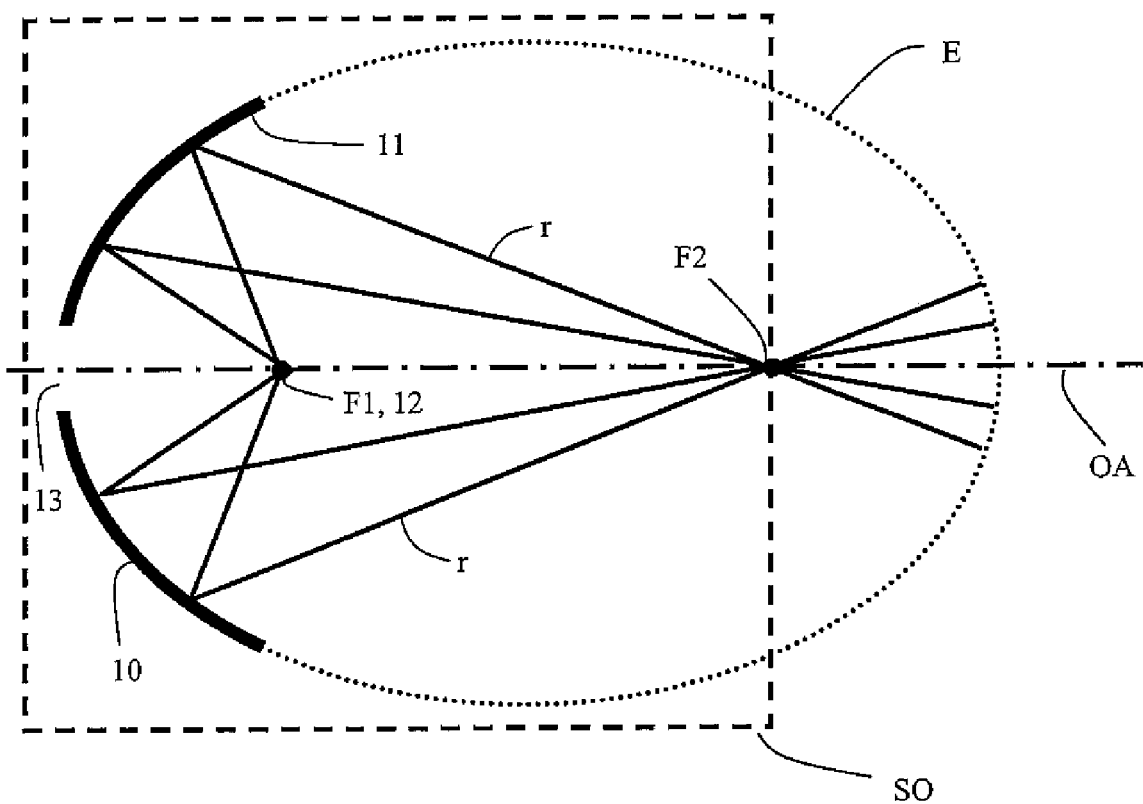
FIG. 2 depicts a schematic view of an embodiment of a radiation source of the lithographic apparatus of FIG. 1.

FIG. 2 shows an embodiment of a radiation source SO, in cross-section, that includes a normal incidence collector 10. The collector 10 has an elliptical configuration, having two natural ellipse focus points F1, F2. Particularly, the normal incidence, collector includes a collector having a single radiation collecting surface 11 having the geometry of the section of an ellipsoid. In other words, the ellipsoid radiation collecting surface section extends along a virtual ellipsoid (part of which is depicted by as dotted line E in the drawing).

As will be appreciated by the skilled person, in case the collector mirror 10 is ellipsoidal (i.e., including a reflection surface or mirror 11 that extends along an ellipsoid), it focuses radiation from one focal point F1 to another focal point F2 along an optical axis OA The focal points are located on the long axis of the ellipsoid at a distance $f=(a^2-b^2)^{1/2}$ from the center of the ellipse, where $2a$ and $2b$ are the lengths of the major and minor axes, respectively. In an embodiment of the lithographic apparatus shown in FIG. 1 that includes a laser produced plasma (LPP) radiation source SO, the collector may be a single ellipsoidal mirror as shown in FIG. 2, where a plasma 12, which produces radiation, is positioned in a plasma formation site, which may be considered to be one focal point (F1) and a second focal point F2 is established in the other focal point (F2) of the mirror. Radiation emanating from the plasma, located in plasma formation site at the first focal point (F1) towards the reflecting surface or mirror 11 and the reflected radiation, reflected by that surface towards the second focus point F2, is depicted by lines r in the drawing. For example, according to an embodiment, a mentioned second focal point F2 may be located between the collector and the illumination system IL of the lithographic apparatus, or be located in the illumination system IL, if desired. An aperture 13 in the collector allows a beam of radiation to pass though the collector 10 to excite fuel delivered to the plasma formation site and/or the plasma 12.

In order to suppress the fuel material (e.g. tin—Sn), in the form, for instance, of ions, atoms, molecules, and particulate debris (e.g. nanodroplets), that are used to generate the plasma from depositing on the mirror surface 11, a gas flow may be introduced to the radiation source to suppress the diffusion of fuel atoms and ions (e.g. tin molecules and ions) from the plasma formation site towards the collector. To a lesser extent such flow may also suppress diffusion of particulate debris from the plasma formation site towards the collector. The suppression gas flow scheme may not be sufficient enough to prevent large amounts of tin atoms from reaching the surface of the collector mirror, thereby depositing there. Moreover, a certain minimum gas density integral is desirable between plasma and collector to slow down fast ions. Without suitable precautions, a high power load from the plasma in to the gas may significantly increase the temperature of the gas, which may decrease the gas density.

Figure 3:
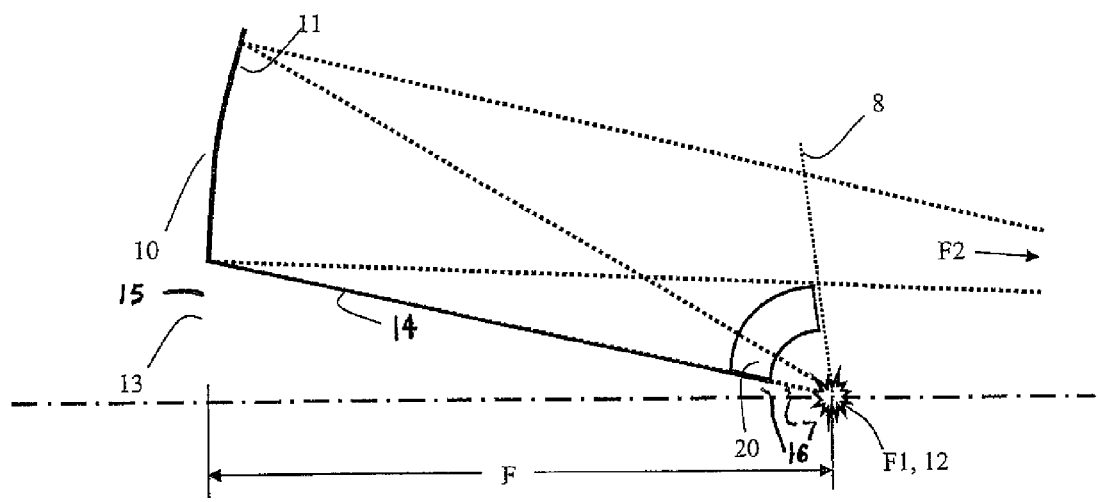
FIG. 3 depicts a more detailed view of a radiation source according to an embodiment of the invention that is suitable for use in the lithographic apparatus of FIG. 1.

FIG. 3 illustrates an embodiment of the present invention that uses a contamination barrier 20 in the form of a single pass foil trap. Only part of the collector is shown and only on one side of the optical axis. The collector 10 is part of an ellipsoidal surface E as shown in FIG. 2. An aperture 13 in the collector 10 is provided to allow a radiation beam (not shown) to pass through the collector to excite the formation of EUV radiation at the plasma formation site at F1. The inner surface of the collector 10 is a mirror 11. The foil trap 20 is constructed and positioned between the plasma 12 and the collector 10 such that the EUV radiation that is generated by the plasma 12 passes through at least a portion of the foil trap 20 only once. Specifically, the periphery of the contamination barrier does not occlude the solid angle subtended by the mirror 11 at the second focal point F2. The foil trap 20 is designed to be a barrier to the plasma expansion and should hinder diffusion of fuel material towards the collector 10. The foil trap 20 may also be used to effectively cool the plasma region. In an embodiment, the inner radius of the foil trap 20 may be about 20 mm and the outer radius may be about 34 mm. In an embodiment, the foil trap 20 may have about 36 foils of about 0.1 mm thickness each. The potential light loss for such an embodiment may be about 4.3% due to the head-on absorption of EUV radiation on the foils. This light loss may be more than compensated for by the fact that a much lower gas density and/or much lower partial pressures of a cleaning chemical may be used in the radiation source. These latter two effects may increase the ability of the gas to transmit EUV between the single pass foil trap 20 and the collector 10 and between the collector 10 and the second focal point F2 (see FIG. 2).

The single pass foil trap 20 is single pass only for foils that do not extend beyond the region subtended by the aperture 13 in the collector 10 at the second focal point F2. This is delimited by ray 7 in FIG. 3 and in the embodiment shown, EUV radiation reflected by the mirror 11 does not pass through the contamination barrier 20 again on its way to towards the second focal point F2. However, a limited extension of the foils or supporting structure outside of this region can be envisioned. This could be beneficial, especially in the direction of the EUV radiation from the plasma towards the edge zone of the collector, indicated by (the ray noted as 8 in FIG. 3). At this angle, the maximum possible foil trap length may be limited due to the reflected inner ray 7. A limited extension of the foil trap in this direction will affect the light transmission at the inner angles, but to a smaller extent than during the first pass of these inner rays, since the foils will be much further apart at that point.

In an embodiment, the foil trap 20 may have a substantially circular shape, although in other embodiments, the foil trap may have any other suitable shape.

FIG. 3 illustrates a two dimensional view of the foil trap 20. The angles and measures may vary with azimuth angle, such that the foil trap or any other structure can have any form, circular symmetric or non-circular symmetric.

The single pass foil trap can be made static, which is may be more beneficial for cooling the foil trap. Further, the foil trap 20 can be made to rotate, either together with a gas inlet nozzle 14, such as a gas inlet cone, shown in FIG. 3, which may be mounted, for instance, with its inlet 15 formed by the aperture 13. In other words, a contamination barrier may be connected to a gas inlet nozzle that is constructed and arranged to rotate or a contamination barrier may be with its own means to rotate. In particular, the contamination barrier 20 may be attached to a gas outlet port 16 of the nozzle 14, as shown in FIG. 3. A rotating single pass foil trap may be beneficial for liquid fuel (e.g. molten Sn) removal by centrifugal forces. Special precautions may then be taken so that any liquid fuel that is spun off is not deposited onto the collector 10 but instead onto a suitable fuel catch structure, located either immediately around the rotating single pass foil trap or further outward. The fuel catch structure is not shown in the Figures. The foils of a rotating single pass foil trap may be shaped such that the fuel is spun off at one particular point of the foil, so that the construction of a fuel catch structure may be simplified.

Figure 4:
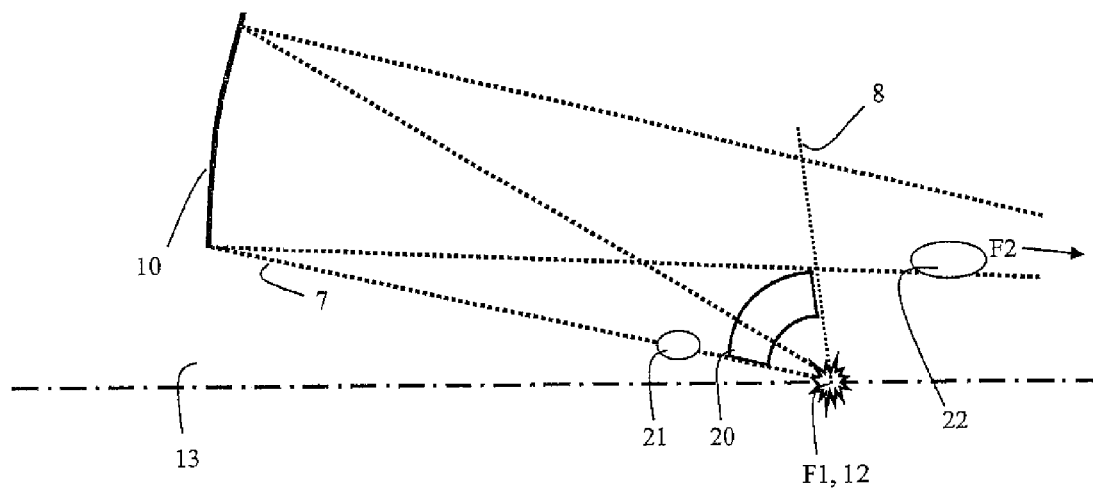
FIG. 4 depicts a more detailed view of a radiation source according to an embodiment of the invention that is suitable for use in the lithographic apparatus of FIG. 1.

In an embodiment of the invention shown schematically in FIG. 4, gas extractors with gas extraction ports 21, 22 located at points near (close to) the plasma 12 are provided, such that a gas flow from the collector 10 towards the plasma formation site F1 may be established, without having extraction directly through the plasma formation site and plasma. This may be useful in cases in which the dynamic pressure of the plasma is high enough that it results in a high pressure build-up in the collector region, which may result in a reduced EUV transmission through the higher density gas. It is also desirable to have a flow from the collector 10 towards the plasma region 12 since this may suppress the diffusion of contamination and debris towards the collector 10. It may also be desirable to ensure a gas flow through the contamination barrier. FIG. 4 shows possible locations for the extraction ports of these additional gas extractors 21, 22. The gas extractor ports 21,22 may be chosen to be placed in or out of the EUV radiation path, depending on the available volume and the specifications of the source. Each gas extractor may include a pump that is constructed and arranged to pump the gas out of the chamber 10. Each pump may be controlled by a pressure controller arranged to control the pump in order to maintain a pressure at a level within a desirable range of about 10 Pa to 400 Pa, more specifically in a range of about 20 Pa to 200 Pa. Due to the relatively high temperature of operation, such gas pressures may not impair transmissivity of the system to the extreme ultraviolet radiation, especially if the gas is hydrogen. Any aforementioned gas extraction port may be disposed, for example, within a distance of 0.5 times the focal length F or 0.3 times the focal length F from the plasma formation site. A gas extraction port may be located between the second focal point and a plane normal to the optical axis and passing through the plasma formation site.

Embodiments of the present invention may substantially prevent fuel (e.g. Sn) material, which may deposit on the contamination barrier 20, from even reaching the collector 10. The contamination barrier 20 may attenuate a shock wave from the expanding plasma, such that it does not, or at least to a lesser extent, move towards the collector 10. The contamination barrier 20 may cool down the plasma formation site and surrounding region, which may make the suppression of gas flows from the plasma formation site more effective. Cooling down of the exhaust gases may also make it easier (e.g., with smaller pipe diameters, and/or less or smaller pumps) to remove the gas flows from the plasma formation site. By provided fast ion attenuation, the lifetime of the collector may be increased. When the deposition rate of fuel material on the collector becomes sufficiently small, additional cleaning agents may be reduced or even eliminated.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc.

Although specific reference may have been made above to the use of embodiments of the invention in the context of optical lithography, it will be appreciated that the invention may be used in other applications, for example imprint lithography, and where the context allows, is not limited to optical lithography.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. A radiation source configured to generate extreme ultraviolet radiation, the radiation source comprising:
    a plasma formation site located at a position in which a fuel is contacted by a beam of radiation to form a plasma;
    a collector constructed and arranged to collect extreme ultraviolet radiation formed at the plasma formation site, the collector comprising a mirror to reflect the extreme ultraviolet radiation to a second focal point, wherein the position of the plasma formation site is at a first focal point of the collector at a focal distance F from the collector measured along an optical axis defined by the first focal point and the second focal point; and
    a contamination barrier having a periphery and located between the plasma formation site and the collector, wherein the periphery of the contamination barrier does not occlude the solid angle subtended by the mirror at the second focal point so that the extreme ultraviolet radiation reflected by the mirror to the second focal point does not pass through the contamination barrier.

2. The radiation source of claim 1, wherein the collector comprises an aperture arranged to allow the beam of radiation to pass through collector to contact the fuel at the plasma formation site.

3. The radiation source of claim 2, wherein the contamination barrier is situated entirely within the solid angle subtended by the aperture at the second focal point.

4. The radiation source of claim 2, wherein the collector comprises a nozzle having a gas inlet port and a gas outlet port arranged to direct a gas flow towards the plasma formation site.

5. The radiation source of claim 4, wherein the aperture is arranged to be the gas inlet port of the nozzle.

6. The radiation source of claim 4, wherein the contamination barrier is attached to the nozzle.

7. The radiation source of claim 6, wherein the contamination barrier is attached to the gas outlet port of the nozzle.

8. The radiation source of claim 1, wherein the contamination barrier does not move relative to the collector.

9. The radiation source of claim 1, wherein the contamination barrier rotates relative to the collector.

10. The radiation source of claim 1, further comprising a gas extraction port positioned and configured to extract gas from near the plasma formation site.

11. The radiation source according to claim 10, wherein the gas extraction port is located within 0.5 F of the plasma formation site.

12. The radiation source according to claim 10, wherein the gas extraction port is located between the second focal point and a plane normal to the optical axis and passing through the plasma formation site.

13. The radiation source according to claim 1, wherein the beam of radiation is a laser beam.

14. A radiation source configured to generate extreme ultraviolet radiation, the radiation source comprising:
    a plasma formation site located at a position in which a fuel is contacted by a beam of radiation to form a plasma,
    a collector constructed and arranged to collect extreme ultraviolet radiation formed at the plasma formation site, the collector comprising a mirror to reflect the extreme ultraviolet radiation to a second focal point, wherein the position of the plasma formation site is at a first focal point of the collector at a focal distance F from the collector measured along an optical axis defined by the first focal point and the second focal point, and
    a gas extraction port positioned and configured to extract gas from near the plasma formation site, wherein the gas extraction port is located within 0.5 F of the plasma formation site.

15. The radiation source according to claim 14, wherein the gas extraction port is located between the second focal point and a plane normal to the optical axis and passing through the plasma formation site.

16. A lithographic apparatus configured to pattern a substrate, the lithographic apparatus comprising:
a radiation source configured to generate extreme ultraviolet radiation, the radiation source comprising
a plasma formation site located at a position in which a fuel is contacted by a beam of radiation to form a plasma,
a collector constructed and arranged to collect extreme ultraviolet radiation formed at the plasma formation site, the collector comprising a mirror to reflect the extreme ultraviolet radiation to a second focal point, wherein the position of the plasma formation site is at a first focal point of the collector at a focal distance F from the collector measured along an optical axis defined by the first focal point and the second focal point, and
a contamination barrier having a periphery and located between the plasma formation site and the collector, wherein the periphery of the contamination barrier does not occlude the solid angle subtended by the mirror at the second focal point so that the extreme ultraviolet radiation reflected by the mirror to the second focal point does not pass through the contamination barrier;
a support constructed and arranged to support a patterning device, the patterning device being configured to pattern extreme ultraviolet radiation from the source directed towards the second focal point; and
a projection system constructed and arranged to project the patterned radiation onto said substrate.

17. A lithographic apparatus configured to pattern a substrate, the lithographic apparatus comprising:
a radiation source configured to generate extreme ultraviolet radiation, the radiation source comprising
a plasma formation site located at a position in which a fuel is contacted by a beam of radiation to form a plasma,
a collector constructed and arranged to collect extreme ultraviolet radiation formed at the plasma formation site, the collector comprising a mirror to reflect the extreme ultraviolet radiation to a second focal point, wherein the position of the plasma formation site is at a first focal point of the collector at a focal distance F from the collector measured along an optical axis defined by the first focal point and the second focal point, and
a gas extraction port positioned and configured to extract gas from near the plasma formation site, wherein the gas extraction port is located within 0.5 F of the plasma formation site;
a support constructed and arranged to support a patterning device, the patterning device being configured to pattern extreme ultraviolet radiation from the source directed towards the second focal point; and
a projection system constructed and arranged to project the patterned radiation onto said substrate.

18. A device manufacturing method comprising:
generating extreme ultraviolet radiation at a plasma formation site;
gathering contamination generated with the extreme ultraviolet radiation from the plasma formation site with a contamination barrier having a periphery and located between the plasma formation site and a collector comprising a mirror;
collecting the extreme ultraviolet radiation that has passed through the contamination barrier with the collector;
reflecting the extreme ultraviolet radiation with the mirror towards a second focal point;
patterning the extreme ultraviolet radiation reflected towards the second focal point with a patterning device; and
projecting the patterned extreme ultraviolet radiation onto a substrate,
wherein the periphery of the contamination barrier does not occlude the solid angle subtended by the mirror at the second focal point so that the extreme ultraviolet radiation does not pass through the contamination barrier.

19. A device manufacturing method comprising:
generating extreme ultraviolet radiation at a plasma formation site;
collecting the extreme ultraviolet radiation that has passed through the contamination barrier with a collector comprising a mirror;
reflecting the extreme ultraviolet radiation with the mirror towards a second focal point;
patterning the extreme ultraviolet radiation reflected towards the second focal point with a patterning device;
projecting the patterned extreme ultraviolet radiation onto a substrate; and
extracting gas from near the plasma formation site with a gas extraction port located within 0.5 F of the plasma formation site.

20. A radiation source configured to generate extreme ultraviolet radiation, the radiation source comprising:
a plasma formation site located at a position in which a fuel is contacted by a beam of radiation to form a plasma;
a collector constructed and arranged to collect extreme ultraviolet radiation formed at the plasma formation site, the collector comprising
a mirror to reflect the extreme ultraviolet radiation to a second focal point, wherein the position of the plasma formation site is at a first focal point of the collector at a focal distance F from the collector measured along an optical axis defined by the first focal point and the second focal point,
an aperture arranged to allow the beam of radiation to pass through collector to contact the fuel at the plasma formation site, and
a nozzle having a gas inlet port and a gas outlet port arranged to direct a gas flow towards the plasma formation site, wherein the aperture is arranged to be the gas inlet port of the nozzle; and
a contamination barrier having a periphery and located between the plasma formation site and the collector, wherein the periphery of the contamination barrier does not occlude the solid angle subtended by the mirror at the second focal point so that the extreme ultraviolet radiation reflected by the mirror to the second focal point does not pass through the contamination barrier.

* * * * *